(12) United States Patent
Augur et al.

(10) Patent No.: US 9,576,735 B2
(45) Date of Patent: Feb. 21, 2017

(54) VERTICAL CAPACITORS WITH SPACED CONDUCTIVE LINES

(71) Applicant: GLOBALFOUNDRIES Inc., Grand Cayman (KY)

(72) Inventors: Roderick Alan Augur, Hopewell Junction, NY (US); Jason Eugene Stephens, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 11 days.

(21) Appl. No.: 14/298,040

(22) Filed: Jun. 6, 2014

(65) Prior Publication Data

US 2015/0357120 A1 Dec. 10, 2015

(51) Int. Cl.
*H01L 49/02* (2006.01)
*H01L 23/522* (2006.01)
(Continued)

(52) U.S. Cl.
CPC .............. *H01G 4/30* (2013.01); *H01G 4/005* (2013.01); *H01G 4/01* (2013.01); *H01G 4/06* (2013.01); *H01G 4/232* (2013.01); *H01G 4/385* (2013.01); *H01L 23/5223* (2013.01); *H01L 28/88* (2013.01); *H01L 28/91* (2013.01); *H01L 2924/0002* (2013.01)

(58) Field of Classification Search
CPC ............ H01L 23/49589; H01L 27/10805; H01L 27/0805; H01L 29/92; H01L 29/76; H01L 29/94; H01L 27/108; H01L 27/10; H01L 23/495; H01L 21/033; H01L 21/0337; H01G 4/005; H01G 4/06; H01G 4/38; G06F 17/50
See application file for complete search history.

(56) References Cited

U.S. PATENT DOCUMENTS 4,801,869 A * 1/1989 Sprogis .................... 714/733
5,264,712 A * 11/1993 Murata et al. ............. 257/71
(Continued)

FOREIGN PATENT DOCUMENTS

TW 200713487 B 9/2005

OTHER PUBLICATIONS

Translation of Taiwan Office Action dated May 17, 2016, for Taiwanese patent application No. 104111392.

*Primary Examiner* — Allen Parker
*Assistant Examiner* — Gustavo Ramallo
(74) *Attorney, Agent, or Firm* — Amerson Law Firm, PLLC (57) ABSTRACT

A capacitor structure includes a first metal layer including a first plurality of horizontally-spaced neutral conductive lines positioned horizontally between a first plurality of horizontally-spaced high voltage conductive lines. The capacitor structure further includes a second metal layer including a second plurality of horizontally-spaced neutral conductive lines positioned horizontally between a second plurality of horizontally-spaced high voltage conductive lines. The capacitor structure further includes a third metal layer positioned vertically below the first metal layer and above the second metal layer, the third metal layer including a third plurality of horizontally-spaced neutral conductive lines positioned horizontally between a first plurality of horizontally-spaced low voltage conductive lines. The first plurality of low voltage lines are positioned vertically between the first and second plurality of neutral lines.

20 Claims, 6 Drawing Sheets

(51) Int. Cl.
*H01G 4/30* (2006.01)
*H01G 4/005* (2006.01)
*H01G 4/06* (2006.01)
*H01G 4/38* (2006.01)
*H01G 4/01* (2006.01)
*H01G 4/232* (2006.01)

(56) References Cited

U.S. PATENT DOCUMENTS

| | | | |
|---|---|---|---|
| 6,255,675 B1* | 7/2001 | Trimberger | H01L 28/40 |
| | | | 257/208 |
| 6,362,509 B1* | 3/2002 | Hart | 257/369 |
| 9,026,973 B2* | 5/2015 | Tien et al. | 716/122 |
| 2006/0180895 A1* | 8/2006 | Chen | H01L 23/5223 |
| | | | 257/595 |
| 2006/0244550 A1* | 11/2006 | Inoue et al. | 333/133 |
| 2007/0296013 A1* | 12/2007 | Chang | H01L 23/5223 |
| | | | 257/306 |
| 2009/0091875 A1* | 4/2009 | Yeh | H01G 4/33 |
| | | | 361/303 |
| 2012/0280296 A1* | 11/2012 | Baars et al. | 257/296 |
| 2014/0264894 A1* | 9/2014 | Tien | H01L 23/5223 |
| | | | 257/773 |

* cited by examiner

VERTICAL CAPACITORS WITH SPACED CONDUCTIVE LINES

BACKGROUND OF THE INVENTION

1. Field of the Disclosure

Generally, the present disclosure relates to vertical capacitors, and, more specifically, to vertical capacitors with spaced conductive lines.

2. Description of the Related Art

Capacitors are employed in integrated circuit designs and other circuit designs to perform varied functions, such as memory access, signal bypassing and signal filtering. Typically, a capacitor includes two conductive plates separated by a layer of dielectric material. One problem with capacitors is that they typically require a relatively large physical region on the chip or board to obtain the desired capacitance.

One method for decreasing the physical area required for the capacitors includes stacking multiple layers of conductive plates together, each plate being one of a pair of oppositely polarized plates separated by an insulating material. However, such a method includes additional fabrication processing steps to realize the stack of plates, resulting in increased cost of manufacture. Another method for decreasing the physical area required for the capacitors includes forming layers of interlaced conductive lines separated by a dielectric material. Such a method allows for a higher capacitance than the stacked plates method given the same region.

Figure 1A:
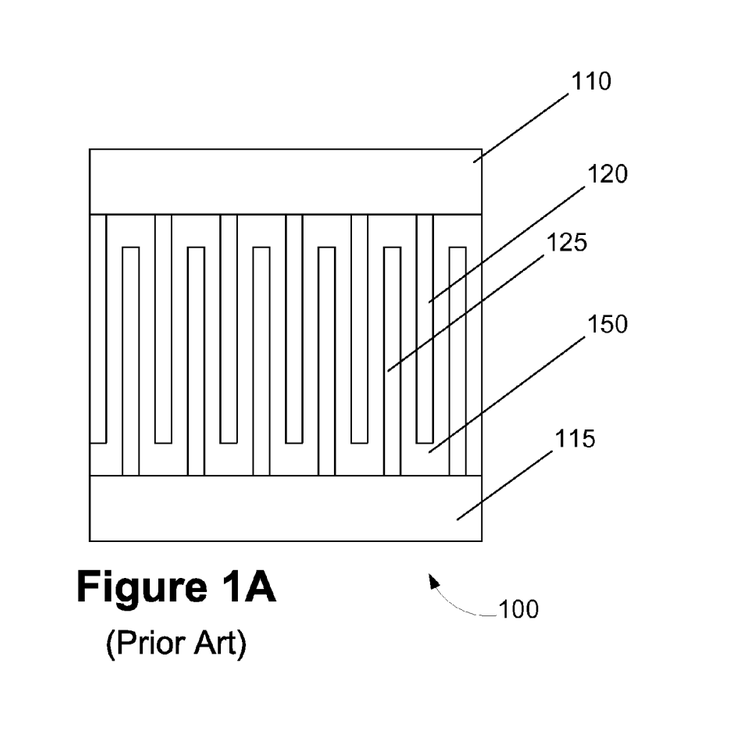
FIGS. 1A-1C depict layers of a prior art vertical capacitor.
Figure 1B:
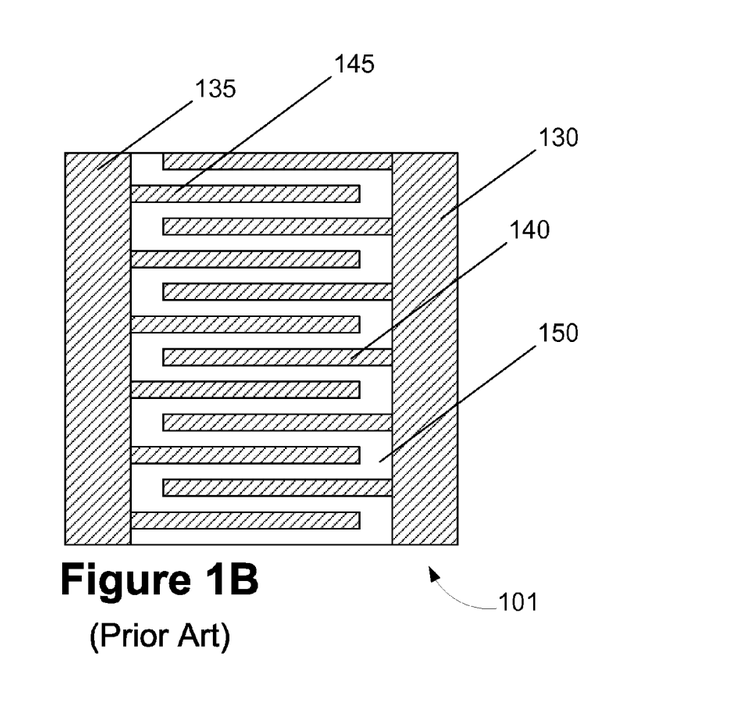

FIGS. 1A and 1B are top views of a first metal layer 100 and a second metal layer 101 of an illustrative prior art capacitor arrangement. As shown in FIG. 1A, the first metal layer 100 includes two frames 110, 115 and a plurality of conductive lines 120, 125 spaced horizontally (on the same layer). Half of the conductive lines 120 are coupled to the top frame 110 while the other half of the conductive lines 125 are coupled to the bottom frame 115. The conductive lines 120, 125 are interlaced such that the conductive lines 120 coupled to the top frame 110 are separated by the conductive lines 125 coupled to the bottom frame 115. A dielectric material 150 separates the conductive lines 120, 125. The dielectric material 150 may be layers of silicon dioxide or other insulating dielectric materials to prevent unwanted electric shorts between layers. Different dielectric materials may be present in combination in various embodiments.

As shown in FIG. 1B, the second metal layer 101 includes two frames 130, 135 and a plurality of conductive lines 140, 145. Half of the conductive lines 140 are coupled to the right frame 130 while the other half of the conductive lines 145 are coupled to the left frame 135. The conductive lines 140, 145 are interlaced such that the conductive lines 140 coupled to the right frame 130 are separated by the conductive lines 145 coupled to the left frame 135. The dielectric material 150 separates the conductive lines 140, 145. Different dielectric materials may be present in combination in various embodiments.

Figure 1C:
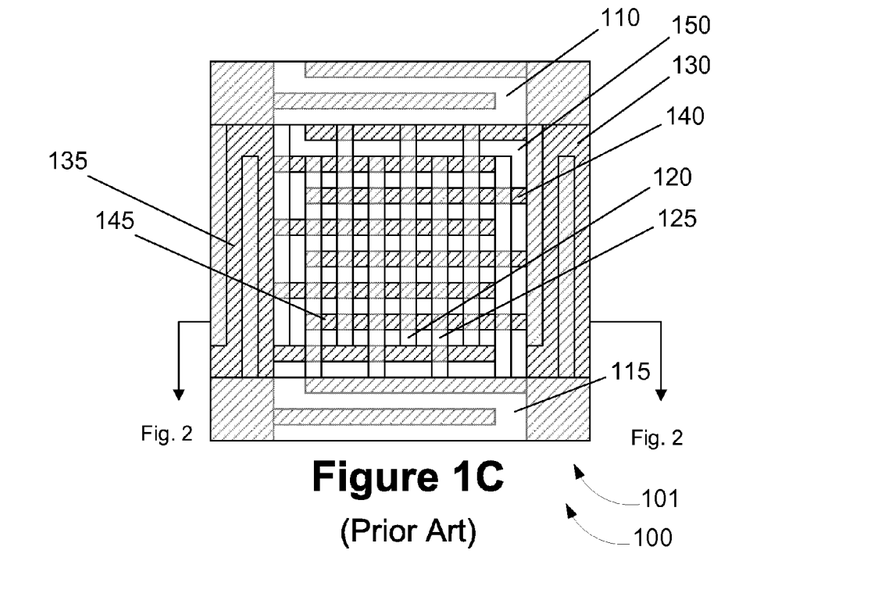

As shown in FIG. 1C, the second metal layer 101 is positioned vertically above the first metal layer 100. The two metal layers 100, 101 are illustrated as partially transparent for clarity, and the frames 110, 115, 130, 135 may be coupled by one or more buses (not shown). The conductive lines 120, 125 of the first metal layer 100 are perpendicular to, i.e. oriented in an orthogonal direction to, the conductive lines 140, 145 of the second metal layer 101. Similarly, a subsequent metal layer (a third metal layer, not shown for clarity) would include conductive lines perpendicular to the second metal layer 101, and a fourth metal layer (not shown for clarity) would include conductive lines perpendicular to the third metal layer as illustrated in the partial cross-section of FIG. 2.

Figure 2:
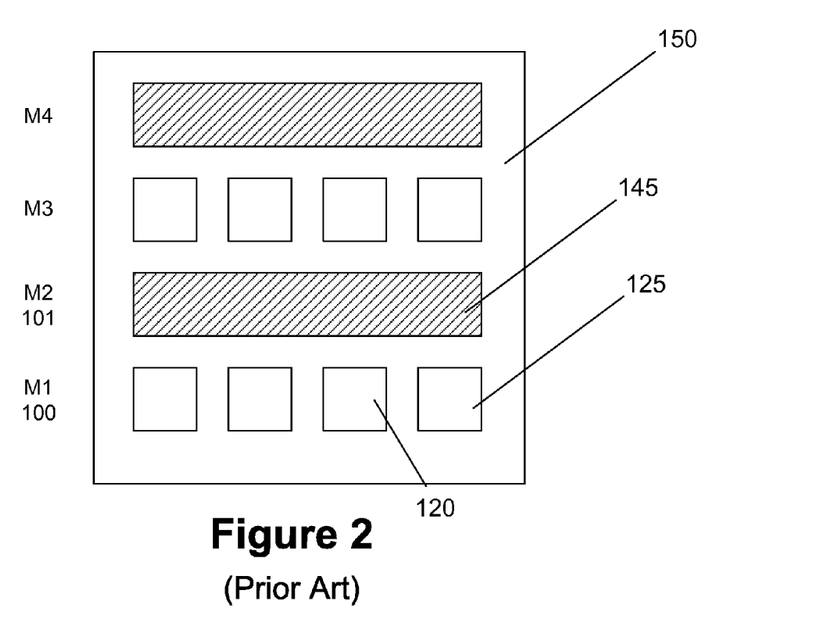
FIG. 2 depicts a cross-sectional view of the layers of the prior art vertical capacitor.

FIG. 2 illustrates a partial cross-sectional view of the layers 100 (M1) and 101 (M2) with additional layers M3 and M4. The M3 layer is substantially similar to the M1 layer while the M4 layer is substantially similar to the M2 layer. The cross-section does not include the frames of the various layers nor every conductive line of each layer. Multiple conductive lines 120, 125 from the first metal layer M1 are visible, but only one conductive line 145 from the second metal layer M2 is visible because the conductive lines from the different layers are perpendicular. Similarly, multiple conductive lines from the third layer M3 are visible, but only one conductive line from the fourth layer M4 is visible. The layers M1, M2, M3 and M4 are separated by the dielectric material 150, as is each individual conductive wire within the same layer. Different dielectric materials may be present in combination in various embodiments.

As the distance between metal layers M1, M2, M3 and M4 decreases, the dielectric material 150 may break down, thereby leading to undesirable electrical shorts and a reduction in the desired capacitance of the overall capacitor structure. The present disclosure is directed to a novel arrangement of spaced conductive lines within the capacitor that may eliminate or at least delay such unwanted dielectric breakdown, while at the same time allowing the conductive lines to be positioned closer together, thus increasing the capacitance in a given physical area.

SUMMARY

The following presents a simplified summary of the disclosure in order to provide a basic understanding of some aspects of the disclosure. This summary is not an exhaustive overview. Its sole purpose is to present some concepts in a simplified form as a prelude to the more detailed description that is discussed later.

Generally, the present disclosure is directed to vertical capacitors with spaced conductive lines. One illustrative capacitor structure disclosed herein includes a first metal layer including a first plurality of horizontally-spaced neutral conductive lines positioned horizontally between a first plurality of horizontally-spaced high voltage conductive lines. The capacitor structure further includes a second metal layer including a second plurality of horizontally-spaced neutral conductive lines positioned horizontally between a second plurality of horizontally-spaced high voltage conductive lines. The capacitor structure further includes a third metal layer positioned vertically below the first metal layer and above the second metal layer, the third metal layer including a third plurality of horizontally-spaced neutral conductive lines positioned horizontally between a first plurality of horizontally-spaced low voltage conductive lines. The first plurality of low voltage lines are positioned vertically between the first and second plurality of neutral lines.

Another illustrative capacitor structure disclosed herein includes a first metal layer including a first plurality of horizontally-spaced neutral conductive lines positioned horizontally between a first plurality of horizontally-spaced high voltage conductive lines. The capacitor structure further includes a second metal layer including a second plurality of horizontally-spaced neutral conductive lines positioned horizontally between a second plurality of horizontally-spaced high voltage conductive lines. The capacitor structure further includes a third metal layer positioned vertically below the first metal layer and above the second metal layer, the third metal layer including a third plurality of horizontally-spaced neutral conductive lines positioned horizontally between alternating high and low voltage conductive lines. The low voltage lines are positioned vertically between the first and second plurality of neutral lines.

Another illustrative capacitor structure disclosed herein includes a first metal layer including a first neutral conductive line positioned horizontally adjacent to a high voltage conductive line. The capacitor structure further includes a second metal layer positioned vertically above the first metal layer, the second metal layer including a second neutral conductive line positioned horizontally adjacent to a low voltage line. The high voltage line is positioned vertically diagonal to the low voltage line, and all the voltage lines are oriented in a direction parallel to one another.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

NOTATION AND NOMENCLATURE

Certain terms are used throughout the disclosure to refer to particular components. However, different entities may refer to a component by different names. This document does not intend to distinguish between components that differ in name but not function. The terms "including" and "comprising" are used herein in open-ended fashion, and thus mean "including, but not limited to."

DETAILED DESCRIPTION

The present subject matter will now be described with reference to the attached figures. Various structures, systems, and devices are schematically depicted in the drawings for purposes of explanation only. The attached drawings are included to describe and explain illustrative examples of the present disclosure. The words and phrases used herein should be understood and interpreted to have a meaning consistent with the understanding of those words and phrases by those in the industry. No special definition of a term or phrase, i.e., a definition that is different from the ordinary and customary meaning as understood by those in the industry, is intended to be implied by consistent usage of the term or phrase herein. To the extent that a term or phrase is intended to have a special meaning, such a special definition will be expressly set forth in the specification in a definitional manner that directly and unequivocally provides the special definition for the term or phrase.

The present disclosure is directed to vertical capacitors with spaced conductive lines. As will be readily apparent, the present method is applicable to a variety of devices, including, but not limited to, logic devices, memory devices, analog devices, etc. With reference to the attached figures, various illustrative embodiments of the methods and devices disclosed herein will now be described in more detail.

The present disclosure is also directed to vertical capacitors with spaced conductive lines formed by one or another patterning techniques that rely on sidewall spacers to increase the special frequency of patterns as compared to the special frequency that can be achieved by photolithography alone.

Figure 3A:
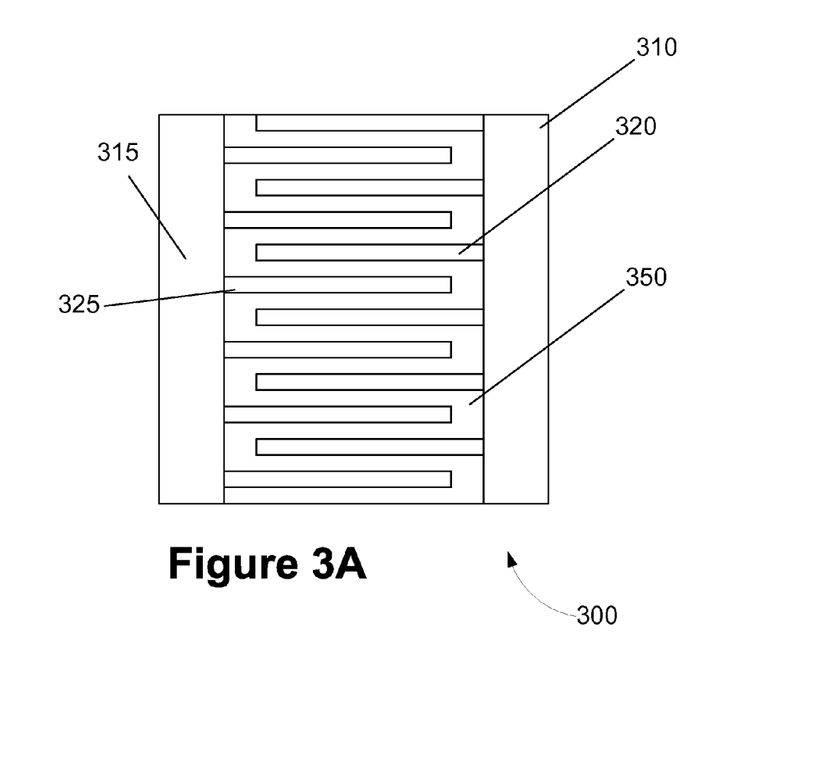
FIGS. 3A-3C depict layers of an illustrative vertical capacitor with spaced conductive lines described herein.
Figure 3B:
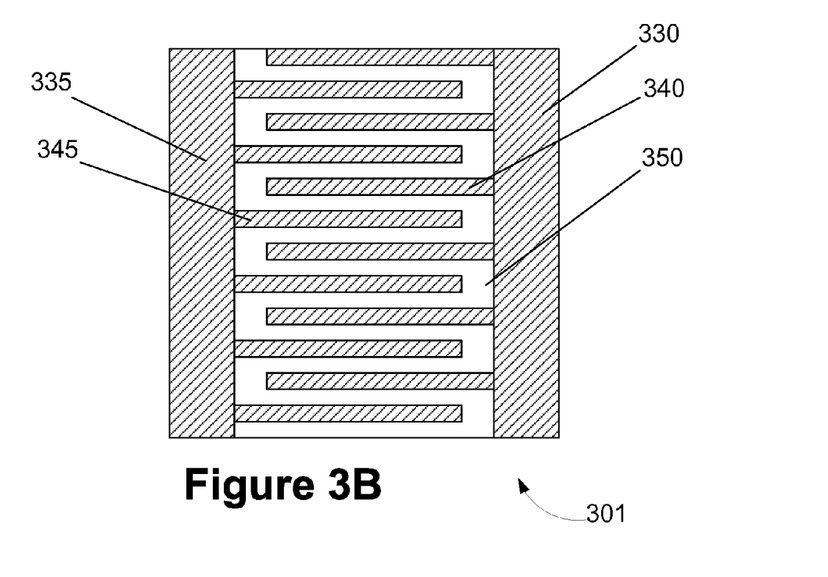

FIGS. 3A and 3B are top views of a first metal layer 300 and a second metal layer 301 of a novel vertical capacitor arrangement disclosed herein. Of course, as will be appreciated by those skilled in the art after a complete reading of the present application, a typical vertical capacitor arrangement may include many metal layers. As shown in FIG. 3A, the first metal layer 300 includes two frames 310, 315 and a plurality of conductive lines 320, 325 spaced horizontally (on the same layer). Half of the conductive lines 320 are coupled to the right frame 310 while the other half of the conductive lines 325 are coupled to the left frame 315. Each frame 310, 315, as well as their respective conductive lines 320, 325, may be coupled to a high voltage supply, a low voltage supply charge or a neutral voltage supply, wherein the terms high and low are relative terms to describe the various voltage levels. In various embodiments, the high voltage charge may be about 2.5 volts and the low voltage charge may be about 0 volts or a ground state for the system. The neutral voltage may be a floating voltage in at least one embodiment, i.e., a neutral conductive line is free to float between voltages. The conductive lines 320, 325 are interlaced such that the conductive lines 320 coupled to the right frame 310 are separated by the conductive lines 325 coupled to the left frame 315. In at least one embodiment, the conductive lines 320, 325 are equidistant from each other, i.e. they are spaced apart evenly, and have the same dimensions, although such a configuration may not be required in all applications. A dielectric material 350 separates the conductive lines 320, 325. The dielectric material 350 may be layers of silicon oxide or other insulating dielectric materials to prevent unwanted electric shorts between layers.

As shown in the top view of FIG. 3B, the second metal layer 301 includes two frames 330, 335 and a plurality of conductive lines 340, 345 spaced horizontally (on the same layer). Half of the conductive lines 340 are coupled to the right frame 330 while the other half of the conductive lines 345 are coupled to the left frame 335. Similar to the first metal layer 300, each frame 330, 335, as well as their respective conductive lines 340, 345, may be coupled to a high voltage supply, a low voltage supply charge or a neutral voltage supply, wherein the terms high and low are relative terms to describe the various voltage levels. In various embodiments, the high voltage charge may be about 2.5 volts and the low voltage charge may be about 0 volts or a ground state for the system. The neutral voltage may be a floating voltage in at least one embodiment, i.e., a neutral conductive line is free to float between voltages. The conductive lines 340, 345 are interlaced such that the conductive lines 340 coupled to the right frame 330 are separated by the conductive lines 345 coupled to the left frame 335. The dielectric material 350 separates the conductive lines 340, 345.

Figure 3C:
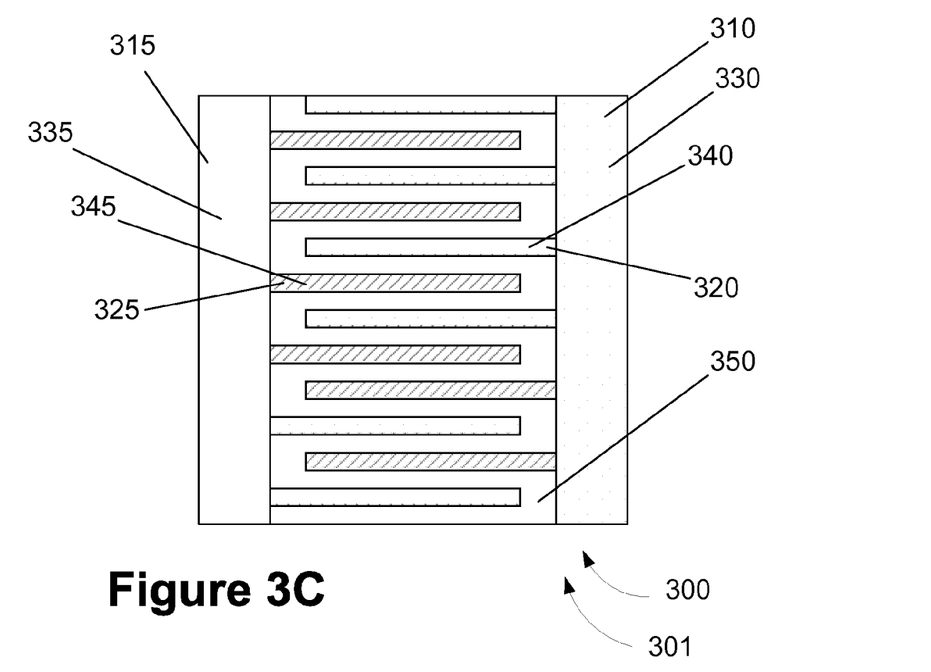
Figure 4A:
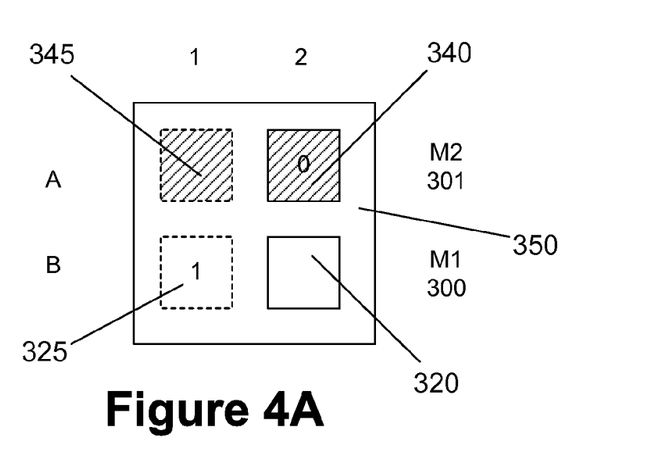
FIGS. 4A-4B depict a cross-sectional view of the layers of the illustrative vertical capacitor with spaced conductive lines described herein.
Figure 4B:
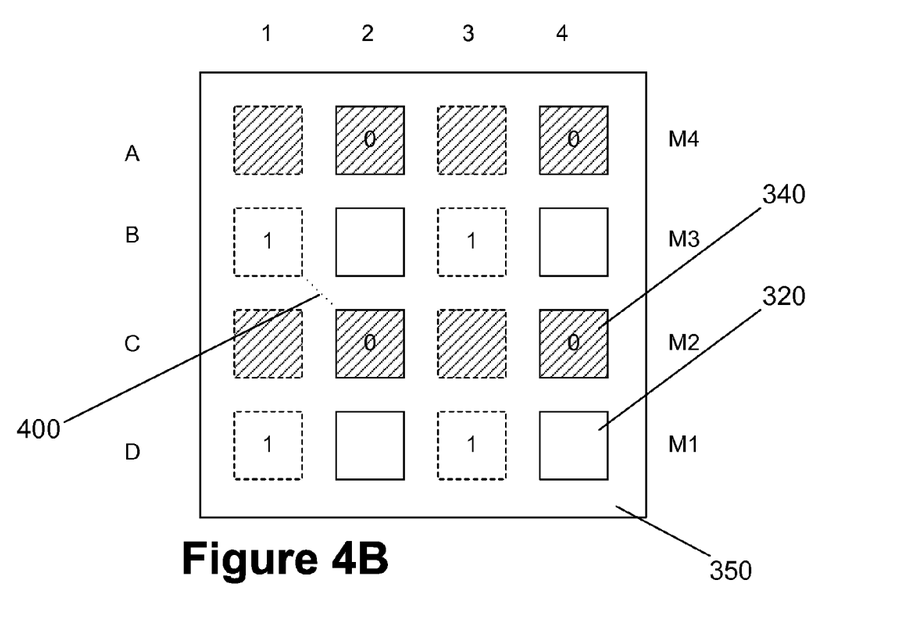

With reference to FIGS. 3C (top view) and 4A-4B (cross-sectional side views), various aspects of the novel capacitor arrangement disclosed herein will now be discussed. In general, unlike the prior art capacitor structures, the conductive lines 320, 325 of the first metal layer 300 are substantially parallel to, i.e. oriented in the same direction as, the conductive lines 340, 345 of the second metal layer 301. As shown in FIGS. 3C, 4A and 4B, the second metal layer 301 is positioned above the first metal layer 300. The two metal layers 300, 301 are illustrated as partially transparent for clarity. As mentioned above, the conductive lines 320, 325 of the first metal layer 300 are substantially parallel to, i.e. oriented in the same direction as, the conductive lines 340, 345 of the second metal layer 301. Similarly, a subsequent metal layer (a third metal layer) would include conductive lines parallel to the second metal layer 301, and a fourth metal layer would include conductive lines parallel to the third metal layer as illustrated in FIGS. 4A and 4B.

The partial cross-sectional view of FIG. 4A illustrates one "unit" of a vertical capacitor structure disclosed herein. A unit is a configuration of conductive lines that may be repeated as often as desired to form a vertical capacitor. Conductive lines 320, 325 from the first metal layer M1 are visible, and conductive lines 340, 345 from the second metal layer M2 are visible because the conductive lines from the layers are substantially parallel, i.e., they are oriented in the same direction. The diagonal shading on a conductive line represents that the conductive line is on an even-numbered layer such as M2, M4, M6 and the like. The absence of diagonal shading represents that a conductive line is on an odd-numbered layer such as M1, M3, M5 and the like. The number "1" represents that a conductive line, such as the conductive line 325 in the first metal layer 300, is a high voltage line, i.e., adapted to carry a high voltage for the system. For example, the frame 315 may transmit 2.5 volts to the high voltage conductive line 325. The number "0" represents that a conductive line, such as the conductive line 340 in the second metal layer 301, is a low voltage line, i.e., adapted to carry a low voltage for the system. For example, the frame 330 may transmit 0 volts to the low voltage conductive line 325 or the line 325 may be grounded. The absence of a "1" or "0" indicates that a conductive line, such as the conductive lines 320, 345 shown in FIG. 4A, is free to float between voltages or is a neutral conductive line.

In one or another of the patterning techniques mentioned above, which employ sidewall spacers, the special frequency of patterns is doubled or quadrupled compared to the special frequency that can be achieved by photolithography alone. For frequency doubling, photolithography is used to define a resist feature of the desired width (called the "mandrel") and double the required pitch. Spacers of a hard material are formed on the sidewalls of the mandrels, leaving a gap between spacers (called the non-mandrel) equal to the width of the resist line. The resist is removed before metal features are formed below the gaps between spacers. In the figure, non-mandrel lines are shown with a dashed outline, and mandrel lines with a continuous outline.

As such, the conductive line 345 at the coordinates "A1" in FIG. 4A represents a non-mandrel and neutral conductive line on an even-numbered layer, i.e., the second metal layer 301. The conductive line 340 at the coordinates "A2" represents a mandrel and low voltage conductive line on an even-numbered layer, i.e., the second metal layer 301. The conductive line 325 at the coordinates "B1" represents a non-mandrel and high voltage conductive line on an odd-numbered layer, i.e., the first metal layer 300. The conductive line 320 at the coordinates "B2" represents a mandrel and neutral conductive line on an odd-numbered layer, i.e., the first metal layer 300.

The distance between the first and second layers 300, 301, the lateral distance between adjacent conductive lines on the same layer, and the height and width of the conductive lines may vary depending upon the application. In at least one embodiment, the distance between the first and second layers may be about 35 nm, and the lateral distance between adjacent conductive lines on the same layer may be about 25 nm. The height and width of the conductive lines may be about 50 nm in at least one embodiment.

FIG. 4B illustrates four units of FIG. 4A together along with a coordinate grid for reference purposes. Specifically, layer M3 includes horizontally-spaced apart (on the same layer) neutral conductive lines (B2 and B4) positioned between high voltage conductive lines (B1 and B3) (except for edge cases) within the same metal layer. Similarly, layer M1 includes horizontally-spaced apart neutral conductive lines (D2 and D4) positioned between high voltage conductive lines (D1 and D3) within the same metal layer. Unlike prior art vertical capacitor structures, each of the conductive lines in all of the metal layers M1-M4 are oriented in the same direction and the long axis of the conductive lines are substantially parallel to one another. Metal layer M2 is vertically positioned between metal layers M1 and M3 and includes neutral conductive lines (C1 and C3) positioned between low voltage conductive lines (C2 and C4). In the configuration of FIG. 4B, the low voltage lines (C2 and C4) of layer M2 are positioned vertically between neutral lines of layers M3 (B2 and B4) and M1 (D2 and D4). That is, the low voltage lines (C2 and C4) are laterally offset from the high voltage lines (D1 and D3) in metal layer M1 and the high voltage lines (B1 and B3) in metal layer M3. As such, due to the vertical spacing between the metal layers M1-M3 and the offset lateral spacing of the low voltage lines (C2 and C4) relative to the location of the high voltage lines (B1 and B3 and D1 and D3), the low voltage lines (C2 and C4) of layer M2 are positioned at a distance 400 from the high voltage lines of layers M3 (B1 and B3) and M1 (D1 and D3). Importantly, this distance 400 is greater than a distance between low and high voltage lines if the low voltage lines were positioned vertically under the high voltage lines, as is the case with prior art capacitor structures where the high voltage and low voltage conductive lines are oriented perpendicular to one another.

As depicted, the neutral lines on the even-numbered layers (e.g., C1 and C3 on layer M2) vertically separate the high voltage lines on the odd-numbered layers (D1 and D3 on layer M1; B1 and B3 on layer M3). Additionally, the neutral lines on vertically adjacent layers are laterally offset from one another (e.g., C1 and C3 on layer M2 as compared to B2 and B4 in layer M3). Also, high voltage lines on one odd-numbered layer, such as M3 (B1 and B3), are vertically aligned with high voltage lines on another odd-numbered layer, such as M1 (D1 and D3). Similarly, the neutral lines on one odd-numbered layer, such as M3 (B2 and B4), are vertically aligned with the neutral lines on another odd-numbered layer, such as M1 (D2 and D4).

Figure 5A:
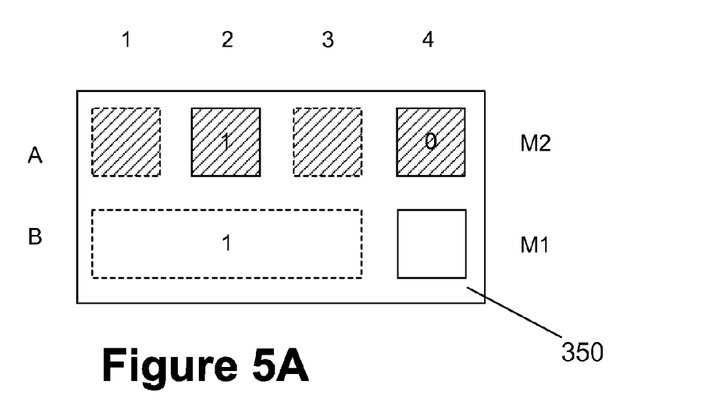
FIGS. 5A-5B depict a cross-sectional view of layers of another illustrative vertical capacitor with spaced conductive lines described herein.

In some embodiments, the conductive lines share substantially the same dimensions. However, in various embodiments, the widths of certain conductive lines are greater than the widths of other conductive lines. Despite the width difference, wide and narrow conductive lines are oriented in the same substantially parallel direction. FIG. 5A depicts a cross-section of one unit of a vertical capacitor illustrating such a width difference in the conductive lines. Similar nomenclature to that described above with respect to FIGS. 4A-4B, e.g., voltage levels, etc., will be employed in FIGS. 5A-5B.

The conductive lines at the coordinates A1 and A3 in FIG. 5A represent non-mandrel and neutral conductive lines on an even-numbered layer (M2). The conductive line at the coordinates A2 represents a mandrel and high voltage conductive line on an even-numbered layer (M2). The conductive line at the coordinates A4 represents a mandrel and low voltage conductive line on an even-numbered layer (M2). The conductive line centered at the coordinates B2 (or spanning the coordinates B1-B3) represents a non-mandrel and high voltage conductive line on an odd-numbered layer (M1). This conductive line has a wider width than the other conductive lines, but it is still oriented in the same direction as the other conductive lines. The conductive line at the coordinates B4 represents a mandrel and neutral conductive line on an odd-numbered layer (M1). The dielectric material 350 separates the conductive lines.

The distance between the layers M1-M4, the lateral distance between adjacent conductive lines on the same layer, and the height and width of the conductive lines may vary depending upon the application. In various embodiments, the distance between each of the layers M1-M4 may be about 50 nm, and the lateral distance between adjacent conductive lines on the same layer may be about 25 nm. The height and width of the conductive lines on even-numbered layers may be about 25 nm in at least one embodiment, while the width of the high voltage line may be about 125 nm.

Figure 5B:
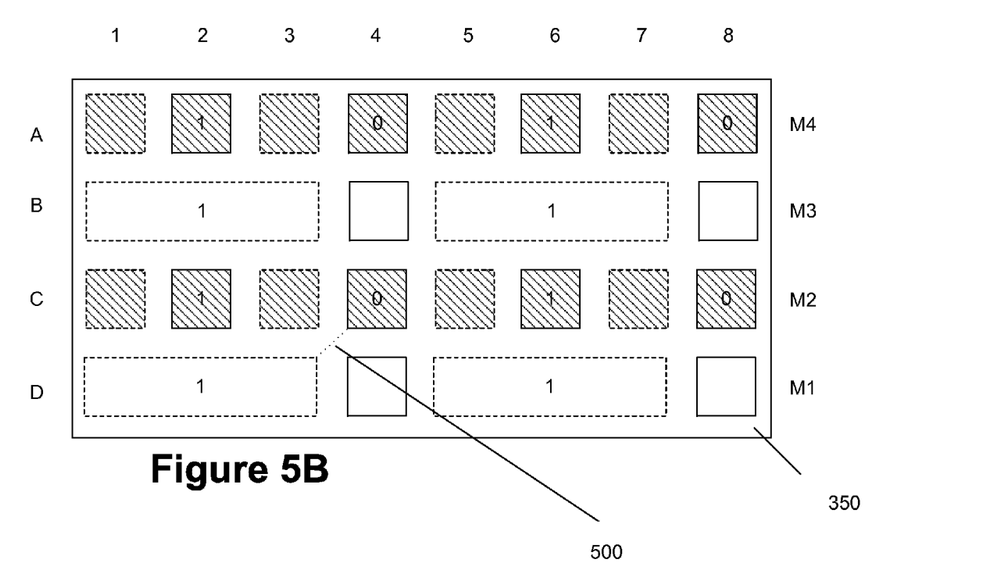

FIG. 5B illustrates four units of FIG. 5A together along with a coordinate grid for reference purposes. Unlike prior art vertical capacitor structures, each of the conductive lines in all of the metal layers M1-M4 are oriented in the same direction and the long axis of the conductive lines are substantially parallel to one another. The layers M3 and M1 include neutral conductive lines (B4, D4, B8, D8) positioned horizontally between wide high voltage conductive lines (B1-3, D1-3, B5-7, D5-7). The layer M2 is positioned vertically between M1 and M3 and includes horizontally-spaced apart (on the same layer) neutral conductive lines (C1, C3, C5, C7) positioned between alternating (except for edge cases) high and low voltage conductive lines (C2, C4, C6, C8). The low voltage lines (A4, C4, A8, D8) of the even-numbered layers are positioned vertically between neutral lines in the odd-numbered layers (B4, D4, B8, D8), i.e., the conductive lines are vertically aligned. Also, the neutral lines on the even-numbered layers (A1, C1, A3, C3, A5, C5, A7, C7) are vertically between any portions of the wide high voltage lines on the odd-numbered layers (B1-3, D1-3, B5-7, D5-7). Consequently, the low voltage lines (A4, C4, A8, C8) are positioned diagonally between, or laterally offset from, the high voltage lines (B1-3, D1-3, B5-7, D5-7). As such, the distance 500 between low voltage and high voltage lines, and the amount of dielectric material 350 between them, is maximized. Importantly, this distance 500 is greater than a distance between low and high voltage lines if the low voltage lines were positioned vertically under the high voltage lines, as is the case with prior art capacitor structures where the high voltage and low voltage conductive lines are oriented perpendicular to one another. In addition, the inclusion of neutral lines (e.g., A1, C1, A3, C3, A5, C5, A7, C7) between high (e.g., A2, C2, A6, C6) and low (e.g., A4, C4, A8, C8) voltage lines in even-numbered metal levels (e.g., M4 or M2) effectively reduces the dielectric space between the high and low voltage lines in those metal levels, which effectively increases the capacitance in those metal levels of the capacitor. This is particularly advantageous when the patterning uses sidewall spacers because, in such cases, the gaps between metal lines are not arbitrary but integer multiples of the spacer width. In at least one embodiment, the wide high voltage lines may be about five times the width of the low voltage lines.

The particular embodiments disclosed above are illustrative only, as the disclosure may be modified and practiced in different but equivalent manners apparent to those having the benefit of the teachings herein. For example, although two or four metal layers are depicted in various examples described herein, the use of many layers having many different sizes of conductive lines is consistent with the current disclosure. Furthermore, no limitations are intended to the details of construction or design herein shown, other than as described in the claims below. It is therefore evident that the particular embodiments disclosed above may be altered or modified and all such variations are considered within the scope and spirit of the disclosure. Accordingly, the protection sought herein is as set forth in the claims below.

What is claimed:

1. A capacitor structure, comprising:
   a first metal layer comprising a first plurality of horizontally-spaced neutral conductive lines coupled to a neutral or floating voltage supply and positioned horizontally between a first plurality of horizontally-spaced high voltage conductive lines coupled to a high voltage supply and positioned in said first metal layer;
   a second metal layer comprising a second plurality of horizontally-spaced neutral conductive lines coupled to said neutral or floating voltage supply and positioned horizontally between a second plurality of horizontally-spaced high voltage conductive lines coupled to said high voltage supply and positioned in said second metal layer; and
   a third metal layer positioned vertically below said first metal layer and above said second metal layer, said third metal layer comprising a third plurality of horizontally-spaced neutral conductive lines coupled to said neutral or floating voltage supply and positioned horizontally between a first plurality of horizontally-spaced low voltage conductive lines coupled to a low voltage supply and positioned in said third metal layer, wherein said first plurality of low voltage lines are positioned vertically between and vertically aligned with said first and second plurality of neutral lines in said first and second metal layers.

2. The capacitor structure of claim 1, wherein each of said first, second and third plurality of neutral lines are oriented in a direction parallel to one another.

3. The capacitor structure of claim 1, wherein said third plurality of neutral lines are positioned vertically between and vertically aligned with said first plurality of high voltage lines and said second plurality of high voltage lines in said first and second layers.

4. The capacitor structure of claim 1, wherein said second plurality of high voltage lines are positioned vertically below said first plurality of high voltage lines.

5. The capacitor structure of claim 1, wherein said second plurality of neutral lines are positioned vertically below said first plurality of neutral lines.

6. The capacitor structure of claim 1, wherein said first plurality of low voltage lines are laterally offset relative to said first plurality of high voltage lines and said second plurality of high voltage lines.

7. The capacitor structure of claim 1, wherein said third plurality of neutral lines are laterally offset relative to said first plurality of neutral lines and said second plurality of neutral lines.

8. The capacitor structure of claim 1, wherein said first plurality of low voltage lines are grounded.

9. The capacitor structure of claim 1, wherein said first and second plurality of high voltage lines are adapted to conduct a voltage greater than 0 volts.

10. A capacitor structure, comprising:
- a first metal layer comprising a first plurality of horizontally-spaced neutral conductive lines coupled to a neutral voltage supply coupled to a neutral or floating voltage supply and positioned horizontally between a first plurality of horizontally-spaced high voltage conductive lines coupled to a high voltage supply and positioned in said first metal layer;
- a second metal layer comprising a second plurality of horizontally-spaced neutral conductive lines coupled to said neutral or floating voltage supply and positioned horizontally between a second plurality of horizontally-spaced high voltage conductive lines coupled to said high voltage supply and positioned in said second metal layer; and
- a third metal layer positioned vertically below said first metal layer and above said second metal layer, said third metal layer comprising a third plurality of horizontally-spaced neutral conductive lines coupled to said neutral or floating voltage supply and positioned horizontally between alternating high and low voltage conductive lines, wherein said low voltage lines are positioned vertically between and vertically aligned with said first and second plurality of neutral lines.

11. The capacitor structure of claim 10, wherein each of said first, second and third plurality of neutral lines are oriented in a direction parallel to one another.

12. The capacitor structure of claim 10, wherein said third plurality of neutral lines are positioned vertically between and vertically aligned with said first plurality of high voltage lines and said second plurality of high voltage lines.

13. The capacitor structure of claim 10, wherein said second plurality of high voltage lines are positioned vertically below said first plurality of high voltage lines.

14. The capacitor structure of claim 10, wherein said second plurality of neutral lines are positioned vertically below said first plurality of neutral lines.

15. The capacitor structure of claim 10, wherein said first plurality of low voltage lines are laterally offset relative to said first plurality of high voltage lines and said second plurality of high voltage lines.

16. The capacitor structure of claim 10, wherein said high voltage lines are positioned vertically between said first plurality of high voltage lines and said second plurality of high voltage lines.

17. The capacitor structure of claim 10, wherein said first and second plurality of high voltage lines and said high voltage lines are adapted to conduct a voltage of greater than 0 volts.

18. The capacitor structure of claim 17, wherein said low voltage lines are adapted to conduct a voltage less than that of said high voltage lines.

19. The capacitor structure of claim 10, wherein said first and second plurality of high voltage lines are five times the width of said low voltage lines.

20. A capacitor structure, comprising:
- a first metal layer comprising a first neutral conductive line coupled to a neutral or floating voltage supply and positioned horizontally adjacent to a high voltage conductive line; and
- a second metal layer positioned vertically above said first metal layer, said second metal layer comprising a second neutral conductive line coupled to said neutral or floating voltage supply and positioned horizontally adjacent to a low voltage line coupled to a low voltage supply, wherein said high voltage line is positioned vertically diagonal to said low voltage line, and wherein all the voltage lines are oriented in a direction parallel to one another.

\* \* \* \* \*